(12) United States Patent
Doi et al.

(10) Patent No.: US 9,304,969 B2
(45) Date of Patent: Apr. 5, 2016

(54) HYBRID CONSTRUCTION MACHINE

(71) Applicant: Kobelco Construction Machinery Co., Ltd., Hiroshima-shi (JP)

(72) Inventors: Takayuki Doi, Hiroshima (JP); Masayuki Komiyama, Hiroshima (JP); Naoki Goto, Hiroshima (JP)

(73) Assignee: KOBELCO CONSTRUCTION MACHINERY CO., LTD., Hiroshima-shi (JP)

( * ) Notice: Subject to any disclaimer, the term of this patent is extended or adjusted under 35 U.S.C. 154(b) by 100 days.

(21) Appl. No.: 13/687,410

(22) Filed: Nov. 28, 2012

(65) Prior Publication Data

US 2013/0151087 A1 Jun. 13, 2013

(30) Foreign Application Priority Data

Dec. 9, 2011 (JP) ................................. 2011-269615

(51) Int. Cl.
*G01R 31/36* (2006.01)
*G06F 17/00* (2006.01)
*E02F 9/20* (2006.01)

(52) U.S. Cl.
CPC .............. *G06F 17/00* (2013.01); *E02F 9/2091* (2013.01); *G01R 31/3624* (2013.01)

(58) Field of Classification Search
CPC ... E02F 9/2091; G06F 17/00; G01R 31/3624; B60W 10/26; B60L 11/1861
USPC ...................................... 701/50; 340/636.12
See application file for complete search history.

(56) References Cited

U.S. PATENT DOCUMENTS

| 6,495,989 B1 * | 12/2002 | Eguchi ........................... 320/132 |
| 2009/0001992 A1 * | 1/2009 | Tsuchiya ........................ 324/426 |
| 2009/0051322 A1 * | 2/2009 | Kubota et al. ................. 320/134 |

FOREIGN PATENT DOCUMENTS

| JP | 59-8789 B2 | 2/1984 |
| JP | 2001-281306 A | 10/2001 |

(Continued)

OTHER PUBLICATIONS

Wikipedia Online Encyclopedia, Actuator, Feb. 4, 2012, Wikipedia Online Encyclopedia.*

(Continued)

*Primary Examiner* — John Q Nguyen
*Assistant Examiner* — Nadeem Odeh
(74) *Attorney, Agent, or Firm* — Oblon, McClelland, Maier & Neustadt, L.L.P.

(57) ABSTRACT

The present charging rate of a battery is accurately calculated. The calculation mode of the present charging rate is switched to a current integration mode during operation of a generator motor while the mode is switched to a voltage reference mode at a predetermined switchover timing. In the current integration mode, charge current of the battery is integrated and added to the initial charging rate and an integrated discharge current value is subtracted from the initial charging rate of the battery to calculate the present charging rate. In the voltage reference mode, the present charging rate is calculated based on a predetermined map and detected voltage of the battery. After calculation of the present charging rate according to the voltage reference mode, the calculation mode is restored from the voltage reference mode to the current integration mode and the suspension of operating the generator motor is cancelled.

5 Claims, 5 Drawing Sheets

(56) References Cited

FOREIGN PATENT DOCUMENTS

| | | |
|---|---|---|
| JP | 2005-014637 A | 1/2005 |
| JP | 2007-155586 A | 6/2007 |

OTHER PUBLICATIONS

Office Action issued Jul. 28, 2015, in Japanese Patent Application No. 2011-269615 (w/English summary).

\* cited by examiner

HYBRID CONSTRUCTION MACHINE

CROSS REFERENCE TO RELATED APPLICATION

This application is based on Japanese Patent application No. 2011-269615 filed in Japan Patent Office on Dec. 9, 2011, the contents of which are hereby incorporated by reference.

BACKGROUND OF THE INVENTION

1. Field of the Invention

The present invention relates to a hybrid construction machine which utilizes a combination of power from an engine and electric power from a battery.

2. Description of the Background Art

The hybrid-type shovel is exemplified to describe the background art.

Hybrid-type shovels comprise, as shown in FIG. 5, a lower propelling body 1, an upper slewing body 2 which is mounted on the lower propelling body 1 to be capable of slewing around an X-axis perpendicular to the ground and a work attachment 6 connected to the upper slewing body 2. The work attachment 6 comprises a boom 3, an arm 4 and a bucket 5.

Hybrid-type shovels also comprise an engine as a power source, a hydraulic pump and a generator motor which are connected to the engine and a battery. The hydraulic pump drives a hydraulic actuator by discharging hydraulic fluid by power from the engine. The generator motor acts as a generator by receiving power from the engine and electric power generated by this action is charged on the battery. The generator motor also acts as an electric motor by receiving electric power from the battery, as appropriate, to assist the engine.

Hybrid-type shovels also comprise a slewing electric motor (work electric motor) as a slewing driving source for the upper slewing body 2. The slewing electric motor is driven by electric power from the battery. Meanwhile, the slewing electric motor acts as a generator when slewing speed is reduced and regenerative electric power generated by this action is charged on the battery.

In the hybrid-type shovels, the upper limit of battery charge-discharge electric current is determined based on "present charging rate" (usually referred to as "SOC [State Of Charge]") which is the currently remaining charged amount of the battery and this upper limit is used for various controls. Therefore, in the hybrid-type shovels, it is necessary to always monitor and know the present charging rate.

Japanese Examined Patent Publication No. S59-8789 (hereinafter referred to as patent literature 1) discloses a calculation method of the present charging rate. More specifically, the calculation method disclosed in patent literature 1 comprises integrating charge current and discharge current from a battery to calculate the quantities of charged electricity and discharged electricity, and adding or subtracting the above quantities of electricity to or from an initial capacity (charging rate at the start point of use of the battery) of the battery to calculate the remaining capacity (present charge rate) of the battery. Namely, the calculation method disclosed in patent literature 1 is the one based on so-called "integration of electric current" (hereinafter also referred to as "current integration method").

Japanese Patent Application Publication No. 2001-281306 (hereinafter referred to as patent literature 2) discloses a calculation method based on so-called "voltage reference" (hereinafter also referred to as "voltage reference method").

More specifically, the calculation method of patent literature 2 comprises determining the present charging rate from the detected terminal voltage of a battery based on a preliminarily stored map for the relation between a terminal voltage and a charging rate of the battery.

In the current integration method, electric current flowed in and out from a battery is integrated regardless of the fluctuation in voltage of the battery upon charge and discharge. Due to this, the current integration method is suitable for calculation during operation of a machine (during battery is charged and discharged), while it has a drawback that it is difficult to accurately calculate the present charging rate because of accumulation of calculation errors due to the sensor tolerance and battery deterioration.

On the other hand, the voltage reference method only requires detection of voltage of a battery. Therefore, the voltage reference method is less affected by the sensor tolerance etc., while it is not suitable for calculation during operation of a machine because the calculation accuracy is reduced when voltage of the battery is significantly fluctuated due to charge and discharge of the battery during operation of the machine.

As described above, both calculation methods have merits and demerits and it is difficult to accurately calculate the present charging rate of a battery depending on operation status of a machine by either methods. Thus, there have been problems such that it is not possible to take full performance of a battery and that a shovel cannot be appropriately controlled.

SUMMARY OF THE INVENTION

An object of the present invention is to provide a hybrid construction machine which allows accurate calculation of the present charging rate of a battery by taking only the advantages of the current integration method and the voltage reference method.

In order to achieve the above object, the present invention provides a hybrid construction machine having a hydraulic actuator, comprising a battery; an engine as a power source; a hydraulic pump which is connected to the engine as a hydraulic source for the hydraulic actuator; a generator motor which is connected to the engine, charges the battery by acting as a generator by power from the engine and assists the engine by acting as an electric motor by electric power from the battery; a voltage detector which detects terminal voltage of the battery; a current detector which detects charge current and discharge current of the battery; and a controller which calculates a present charging rate as a currently remaining charged amount of the battery, wherein the controller (A) can switch over a calculation mode of calculating the present charging rate between a current integration mode, in which the charge current and the discharge current of the battery detected by the current detector are integrated and the integrated value of the charge current is added to an initial charging rate of the battery as well as the integrated value of the discharge current is subtracted from the initial charging rate of the battery to calculate the present charging rate, and a voltage reference mode in which the present charging rate is determined based on a predefined relation between terminal voltage and charging rate of the battery and terminal voltage of the battery detected by the voltage detector; (B) calculates, during operation of the generator motor, the present charging rate according to the current integration mode, and suspends operation of the generator motor at a predetermined switchover timing and calculates the present charging rate according to the voltage reference mode; and (C) after calculation of the present charging rate according to the voltage reference mode, restore the calculation mode back to the current integration mode from the voltage reference mode and cancels the suspension of operating the generator motor.

According to the present invention, the present charging rate of the battery can be accurately calculated by combining the current integration method and the voltage reference method and taking only the advantages of these methods.

DETAILED DESCRIPTION OF THE PREFERRED EMBODIMENTS OF THE INVENTION

The embodiments of the present invention are described hereinbelow by referring to the attached figures. The following embodiments are examples substantiating the present invention and do not limit the technical scope of the present invention.

As an example of the embodiments of the present invention, a hybrid-type shovel is described.

Figure 5:
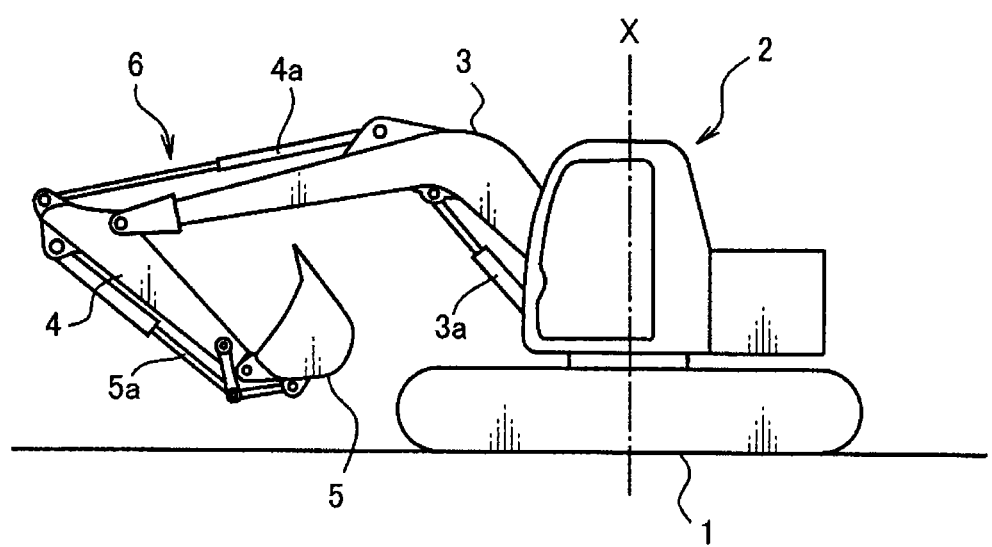
FIG. 5 is a schematic side diagram of a hybrid-type shovel to which the present invention is applied.

The hybrid-type shovel comprises, as shown in FIG. 5, a self-propelled lower propelling body 1, an upper slewing body 2 which is mounted on the lower propelling body 1 to be capable of slewing around an X-axis perpendicular to the ground and a work attachment 6 connected to the upper slewing body 2.

The work attachment 6 comprises a boom 3 having a base end section that is attached to the upper slewing body 2 so as to be able to rise and fall relative to the upper slewing body 2, an arm 4 having a base end section that is attached to the tip of the boom 3 so as to be able to swing relative to the tip of the boom 3 and a bucket 5 attached to the tip of the arm 4 so as to be able to swing relative to the tip of the arm 4. The work attachment 6 also comprises a boom cylinder 3a which raises and lowers the boom 3 relative to the upper slewing body 2, an arm cylinder 4a which swings the arm 4 relative to the boom 3 and a bucket cylinder 5a which swings the bucket 5 relative to the arm 4. The respective cylinders 3a to 5a constitute the hydraulic actuator in the present embodiment.

The embodiment of the present invention is described in detail hereinafter by referring to FIGS. 1 to 4.

Figure 1:
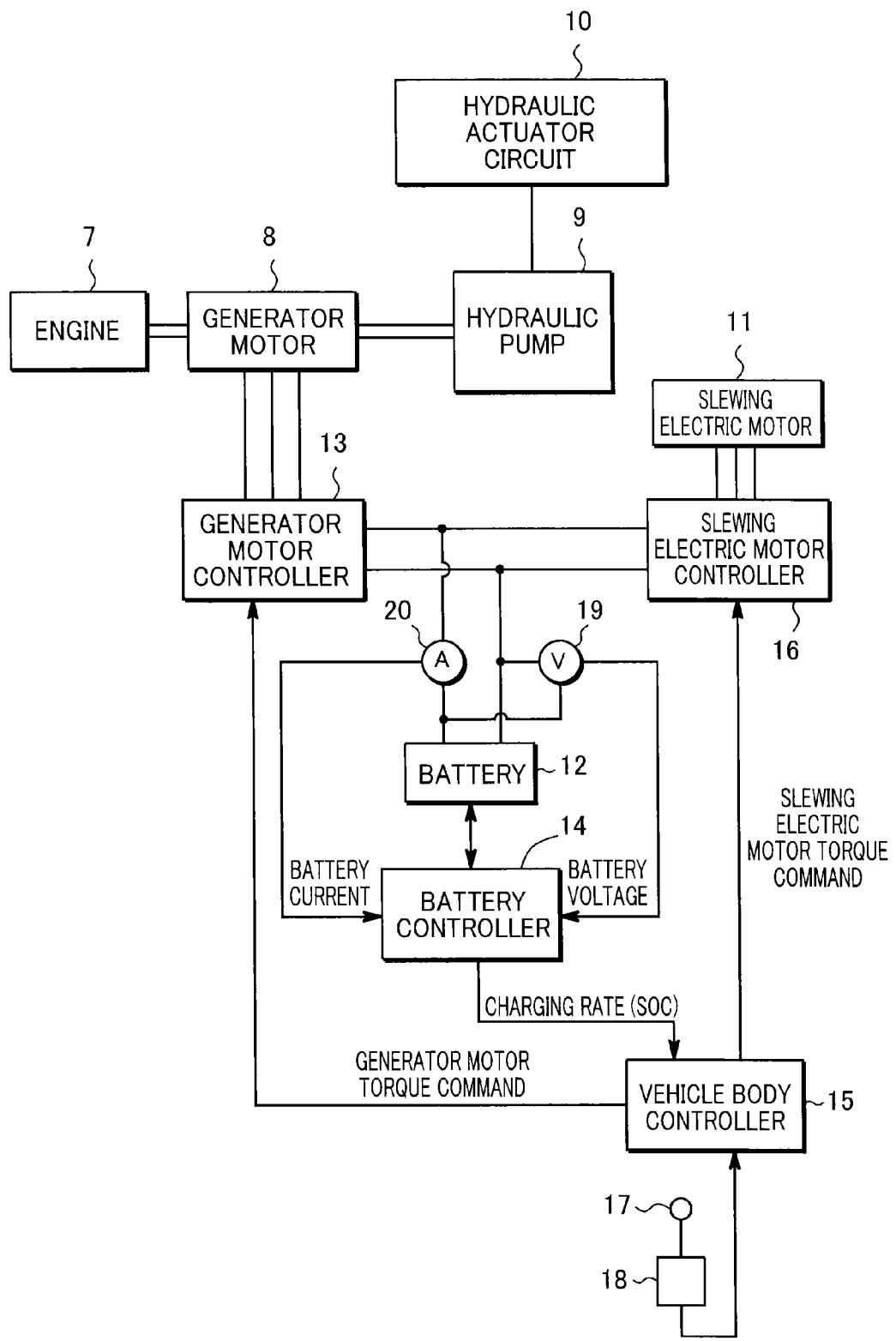
FIG. 1 is a system configuration diagram of the embodiment according to the present invention.

FIG. 1 shows a system configuration of the hybrid shovel according to the present embodiment.

The hybrid shovel comprises a battery 12; an engine 7 as a power source; a hydraulic pump 9 and a generator motor 8 which are connected to the engine 7; a voltage sensor (voltmeter: voltage detector) 19 which detects terminal voltage (voltage between terminals) of the battery 12; a current sensor (ammeter: current detector) 20 which detects charge current and discharge current of the battery 12; a battery controller 14 and a vehicle body controller 15 (respective controllers 14 and 15 constitute the controller) for calculating the present charging rate which is the currently remaining charged amount of the battery 12; a slewing electric motor (work electric motor) 11 which slews the upper slewing body 2 relative to the lower propelling body 1; a slewing operating lever (operating member) 17 which is operated to drive the slewing electric motor 11; a slewing operation detector (e.g. potentiometer) 18 which detects operation and an operation amount of the slewing operating lever 17; a generator motor controller 13 which controls drive of the generator motor 8; and a slewing electric motor controller 16 which controls drive of the slewing electric motor 11.

The hydraulic pump 9 is mechanically connected to the engine 7 as a hydraulic source for the respective cylinders 3a to 5a. More specifically, the hydraulic pump 9 is connected to hydraulic actuator circuits 10 (only one of them is shown) provided for each of the cylinders 3a to 5a. The respective cylinders 3a to 5a are driven by supplying hydraulic fluid to the respective cylinders 3a to 5a from the hydraulic pump 9 via the hydraulic actuator circuits 10.

The slewing electric motor 11 slews the upper slewing body 2 relative to the lower propelling body 1 by electric power from the battery 12 as well as charges the battery 12 by acting as a generator when slewing speed of the upper slewing body 2 is reduced.

The generator motor 8 charges the battery 12 by acting as a generator by power from the engine 7 as well as assists the engine 7 by acting as an electric motor by electric power from the battery 12. More specifically, the generator motor 8 is mechanically connected to the engine 7 as well as electrically connected to the battery 12 via the generator motor controller 13. The battery 12 is a rechargeable capacitor such as a nickel-metal-hydride battery or lithium ion battery.

The battery controller 14 and the vehicle body controller 15 (hereinafter also collectively referred to as "controllers") basically control charge and discharge actions of the battery 12 according to the present charging rate and a switchover action of the generator motor 8 between the action as a generator and the action as an electric motor.

More specifically, the controllers activate the generator motor 8 as a generator so as to charge the battery 12 when, during operation of the construction machine, the charged amount of the battery 12 is decreased. Electric power generated by the action of the generator motor 8 is sent to the battery 12. On the other hand, the controllers activate the generator motor 8 as an electric motor by stored electric power of the battery 12 in order to assist the engine 7 as appropriate.

The controllers also determine the upper limit of charge-discharge electric current of the battery 12 according to the present charging rate and control various shovel actions based on the upper limit.

On the other hand, the slewing electric motor 11 is connected to the battery 12 via the slewing electric motor controller (convertor) 16. Operation of the slewing electric motor 11 is controlled by a torque command from the vehicle body controller 15 depending on the operation of the slewing operating lever 17.

The controllers also receive detection signals from the slewing operation detector 18, the voltage sensor 19 and the current sensor 20. More specifically, the battery controller 14 receives detection signals from the voltage sensor 19 and the current sensor 20. The vehicle body controller 15 receives a detection signal from the slewing operation detector 18.

The controllers calculate, in addition to the above basic actions, the present charging rate of the battery 12 which forms the base of the controls, based on charge current and discharge current of the battery 12 and voltage (terminal voltage) of the battery 12.

More specifically, the battery controller 14 can switch over the calculation mode of the present charging rate between the current integration mode and the voltage reference mode.

In the current integration mode, charge current and discharge current of the battery 12 detected by the current sensor 20 are integrated. In the current integration mode, the present charging rate is further calculated by adding the integrated value of the charge current to an initial charging rate of the battery 12 and subtracting the integrated value of the discharge current from the initial charging rate of the battery 12.

In the voltage reference mode, the present charging rate is determined based on a predefined relation between terminal voltage and charging rate of the battery (a map shown in FIG. 4) and terminal voltage of the battery 12 detected by the voltage sensor 19.

The controllers calculate the present charging rate according to the current integration mode during normal operation. The controllers force the generator motor 8 to suspend and switch the calculation mode to the voltage reference mode when the accumulated operation time of the machine reaches to a predetermined value.

Figure 2:
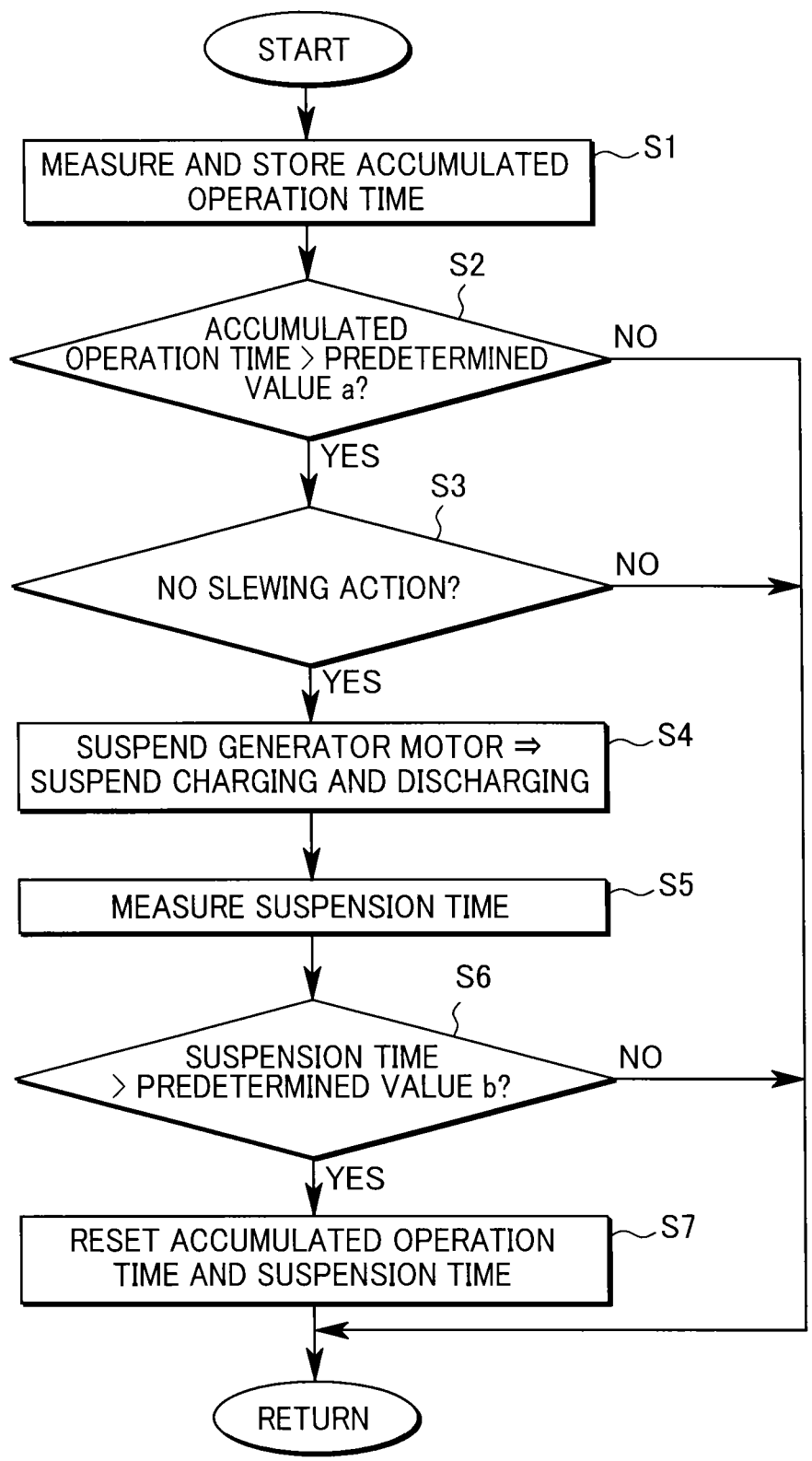
FIG. 2 is a flow chart showing the process executed by a vehicle body controller shown in FIG. 1.
Figure 3:
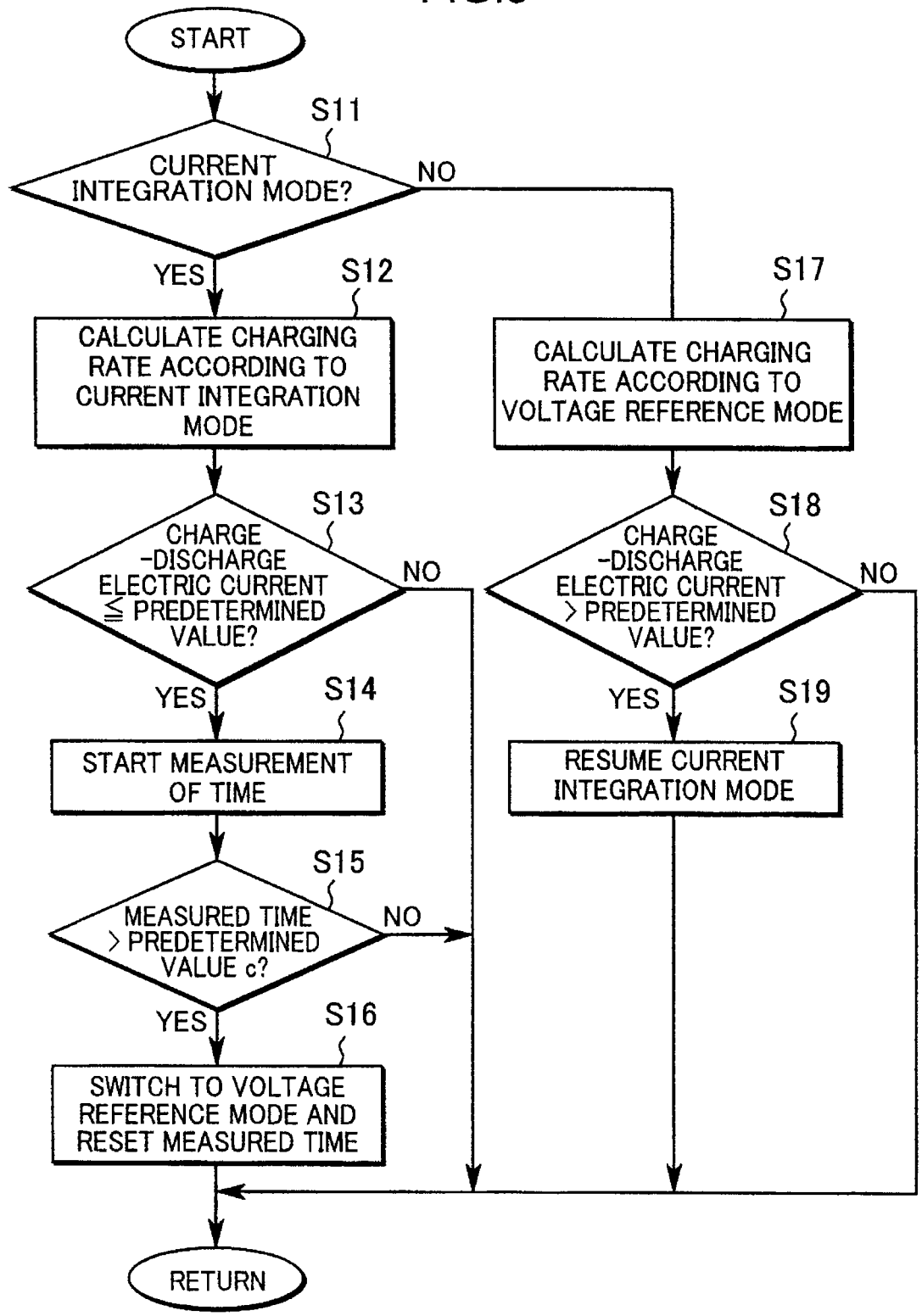
FIG. 3 is a flow chart showing the process executed by a battery controller shown in FIG. 1.
Figure 4:
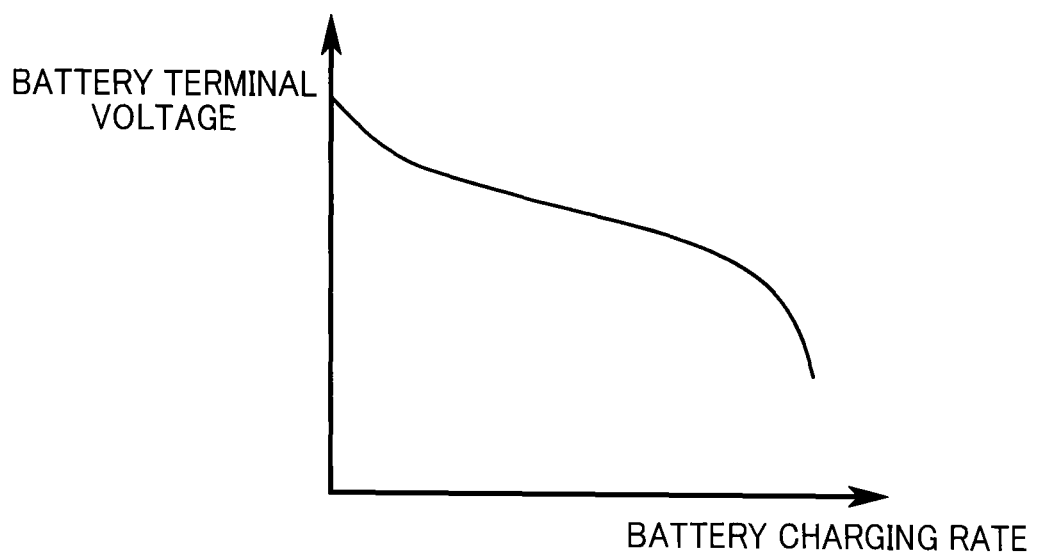
FIG. 4 is a diagram showing a map used for calculating the present charging rate according to the voltage reference mode.

This process is described in detail by way of the flow charts shown in FIGS. 2 and 3.

First, control by the vehicle body controller 15 is described by referring to FIG. 2.

The vehicle body controller 15 forces the generator motor 8 to suspend at each constant accumulated operation time provided that there is no slewing action. Under this situation, the vehicle body controller 15 switches over the calculation mode of the present charging rate from the running current integration mode to the voltage reference mode and prepares for the calculation of the present charging rate according to the voltage reference mode.

Thus, when the control starts, the accumulated operation time of the hybrid-type shovel (generator motor 8) is measured and stored in the step S1. Specifically in the present embodiment, the measurement of the accumulated operation time is initiated when the operation of the generator motor 8 is started. Next, in the step S2, it is determined whether or not the accumulated operation time is reached to a predetermined value a (which is appropriately determined according to the degree of the accumulated error etc.).

Only when the decision is "YES" in the step S2, the process progresses to the step S3 in which the presence or absence of slewing action is determined. When the decision is "YES" (absence of slewing action) in the step S3, the generator motor 8 is forced to suspend in the step S4. More specifically, the vehicle body controller 15 shown in FIG. 1 sends a suspension command (generator motor command torque=0) to the generator motor controller 13.

Accordingly, the generator motor 8 is suspended, and charge and discharge actions by the action of the slewing electric motor 11 are also suspended because the decision of "YES" is made in the step S3. Therefore, charge-discharge electric current of the battery 12 is 0 in this situation.

In the step S5, a suspension time of the generator motor 8 is measured. In the step S6, the measured suspension time is compared to a predetermined value b. When it is determined that the measured suspension time > the predetermined value b in the step S6, the accumulated operation time and the suspension time are reset in the step S7 and the process returns to the step S1.

The predetermined value b is determined as a time required so that polarization of the battery 12 does not affect the detection of terminal voltage of the battery 12 anymore. Namely, by continuously suspending the generator motor 8 for the suspension time corresponding to the predetermined value b, terminal voltage of the battery 12 is allowed to be stabilized at an equal level as open voltage, so that the situation suitable for calculation of the present charging rate according to the voltage reference mode can be created.

When the decision is "NO" in the steps S2, S3 and S6, the process also returns to the step S1.

Next, control by the battery controller 14 is described by referring to FIG. 3.

The battery controller 14 switches the calculation mode as follows in cooperation with the vehicle body controller 15.

The initial mode (calculation mode at the start of control) is the current integration mode.

When control is started, it is determined whether or not the calculation mode is the current integration mode in the step S11. When the decision is "YES" (current integration mode) in the step S11, it is assumed that the accumulated operation time has not reached to the predetermined value a and the generator motor 8 has not been suspended. Under such a situation, the present charging rate is calculated according to the current integration mode in the step S12.

In the following step S13, it is determined whether or not the charge-discharge electric current is at or lower than a predetermined value. More specifically, it is determined whether or not the charge current is at or lower than a predetermined value and whether or not the discharge current is at or lower than a predetermined value. Namely, it is determined whether or not the generator motor 8 and the slewing electric motor 11 are suspended. When the charge current and the discharge current are at or lower than the predetermined values as a result of control by the vehicle body controller 15 so as to stop the generator motor 8 and the slewing electric motor 11, the decision of "YES" (charge-discharge electric current≤predetermined value) is made in the step S13.

In the following step S14, time measurement is started and the measured time is compared to a predetermined value c in the step S15. When the decision is "YES" (measured value>predetermined value c) in the step S15, the controller 14 switches over the calculation mode of the present charging rate from the current integration mode to the voltage reference mode and resets the measured time.

The predetermined value c is set to be almost the same as the predetermined value b for the suspension time of the generator motor 8 in FIG. 2.

Accordingly, the calculation mode of the present charging rate is switched from the current integration mode to the voltage reference mode in the steps S13 to S16, and the process returns to the step S11 under this situation. In the step S11, the decision is then made as "NO" (not in current integration mode: but in voltage reference mode) and the present charging rate is calculated according to the voltage reference mode in the step S17.

Meanwhile, charge-discharge electric current is monitored. In the step S18, it is determined whether or not charge-discharge electric current of the battery 12 has exceeded a predetermined value (a value indicating the operation of the generator motor 8 or the slewing electric motor 11). More specifically, it is determined whether or not charge current has exceeded the predetermined value and whether or not discharge current has exceeded the predetermined value. Namely, it is determined if at least one of the generator motor 8 and the slewing electric motor 11 is in action. When the charge current or the discharge current exceeds the predetermined value, the decision of "YES" is made in the step S18, the calculation mode is automatically restored to the current integration mode and the process returns to the step S11.

As described above, in the above embodiment, the present charging rate is calculated according to the current integration mode which is not affected by fluctuation in voltage during normal operation. When a predetermined switchover timing is arrived (a timing when the accumulated operation time reaches to a predetermined value), the generator motor 8 is suspended automatically and the battery 12 stops charging and discharging. The calculation mode can be switched to the voltage reference mode which has less calculation errors due to errors and deterioration of sensors when voltage is stabilized.

Due to this, according to the above embodiment, the present charging rate of the battery 12 which forms the base of upper limit decision of charge and discharge can be accurately calculated, so that appropriate control can be obtained so as to take full advantage of the performance of the battery 12.

Further, in the above embodiment, the calculation mode returns to the original current integration mode and the suspension of operating the generator motor 8 is canceled after calculation of the present charging rate according to the voltage reference mode. Therefore, immediately after calculation of the present charging rate according to the voltage reference mode, the normal operation can be automatically restored.

Therefore, according to the above embodiment, the present charging rate of the battery 12 can be accurately calculated by taking only advantages of the current integration method and the voltage reference method.

In the above embodiment, the calculation mode is switched to the voltage reference mode based on accumulation of time during which the hybrid construction machine is actually in operation (accumulated operation time). Due to this, the calculation mode can be switched at an appropriate timing compared to when the switchover is carried out based on a mere time course including operation suspension time. Namely, according to the above embodiment, such disadvantages of excessive increase in calculation error due to delay in switching between the calculation modes or unnecessary suspension of operating the generator motor 8 due to switchover of the calculation mode before accumulation of calculation errors can be prevented.

According to the above embodiment, the calculation mode can be switched from the current integration mode to the voltage reference mode based on the operation time of the generator motor 8 which directly contributes to change in the present charging rate. Due to this, the switchover timing can be set in more appropriate manner.

In the above embodiment, the present charging rate is calculated under the situation such that the generator motor 8 is continuously suspended for a certain period of time. Due to this, the present charging rate can be calculated according to the voltage reference mode when voltage of the battery 12 is at a value corresponding to open voltage. Therefore, effects from polarization of the battery 12 can be avoided to increase calculation accuracy.

In the above embodiment, the calculation mode is switched to the voltage reference mode provided that the slewing electric motor 11 is not operated for slewing motion, namely, charge or discharge is not carried out due to the action of the slewing electric motor 11. Due to this, the present charging rate can be more accurately calculated when voltage of the battery 12 is stabilized.

In the above embodiment, control of the generator motor 8 by the vehicle body controller 15 and control for switchover of the calculation modes by the battery controller 14 are described as distinct control flows (FIGS. 2 and 3). However, they can be controlled in a series of flows.

The present invention can be applied not only to the hybrid-type shovel but also equally to construction machines other than the hybrid-type.

In the above embodiment, the construction machine is exemplified in which only the slewing electric motor is used as a work electric motor. However, the present invention can also be applied to construction machines comprising other work electric motors.

In this case, it is preferably configured that the calculation mode is switched to the voltage reference mode provided that all work electric motors relating to charge and discharge of the battery are not in operation.

In the above specific embodiments, the invention having the following configurations is mainly encompassed.

Namely, the present invention provides a hybrid construction machine having a hydraulic actuator, comprising a battery; an engine as a power source; a hydraulic pump which is connected to the engine as a hydraulic source for the hydraulic actuator; a generator motor which is connected to the engine, charges the battery by acting as a generator by power from the engine and assists the engine by acting as a electric motor by electric power from the battery; a voltage detector which detects terminal voltage of the battery; a current detector which detects charge current and discharge current of the battery; and a controller which calculates the present charging rate as a currently remaining charged amount of the battery, wherein the controller (A) can switch over a calculation mode of calculating the present charging of rate between a current integration mode in which the charge current and the discharge current of the battery detected by the current detector are integrated and the integrated value of the charge current is added to an initial charging rate of the battery as well as the integrated value of the discharge current is subtracted from the initial charging rate of the battery to calculate the present charging rate and a voltage reference mode in which the present charging rate is determined based on a predefined relation between terminal voltage and charging rate of the battery and terminal voltage of the battery detected by the voltage detector; (B) calculates, during operation of the generator motor, the present charging rate according to the current integration mode, and suspends operation of the generator motor at a predetermined switchover timing and calculates the present charging rate according to the voltage reference mode; and (C) after calculation of the present charging rate according to the voltage reference mode, resumes the calculation mode back to the current integration mode from the voltage reference mode and cancels the suspension of operating the generator motor.

In the present invention, the present charging rate is, during normal operation, calculated according to the current integration mode which is not affected by fluctuation in voltage. When a predetermined switchover timing is arrived, the generator motor is automatically suspended and charge and discharge of the battery are suspended. Accordingly, the calculation mode can be switched to the voltage reference mode which has less calculation errors due to errors and deterioration of sensors when voltage is stabilized.

Due to this, according to the present invention, the present charging rate of a battery can be accurately calculated which forms the base of upper limit determination of charging and discharging, so that appropriate control can be provided so as to take full advantage of the performance of the battery.

In the present invention, after calculation of the present charging rate according to the voltage reference mode, the calculation mode returns to the original current integration mode and the suspension of operating the generator motor is also canceled. Due to this, normal operation is automatically restored immediately after calculation of the present charging rate according to the voltage reference mode.

Therefore, according to the present invention, the present charging rate of the battery can be accurately calculated by taking only advantages of the current integration method and the voltage reference method.

In the above hybrid construction machine, it is preferable that the above controller measures the accumulated operation time of the hybrid construction machine as well as defines the switchover timing based on the timing when the above accumulated operation time reaches to a predetermined value.

The present charging rate varies according to accumulation of time during which the hybrid construction machine is actually in operation (accumulated operation time). Due to this, the calculation mode can be switched at an appropriate timing compared to when the switchover is carried out based on a mere time course including operation suspension time. Namely, according to the above embodiment, such disadvantages of excessive increase in calculation error due to delay in switchover between the calculation modes or unnecessary suspension of operating the generator motor due to switchover of the calculation mode before accumulation of calculation errors can be prevented.

In the above hybrid construction machine, it is preferred that the accumulated operation time of the construction machine is defined by a continuous operating time of the generator motor, and that the controller starts measurement of the accumulated operation time at the same time as the generator motor starts operation thereof and resets the accumulated operation time according to the suspension of operating the generator motor due to the above switchover timing.

According to this embodiment, the calculation mode can be switched from the current integration mode to the voltage reference mode based on the operation time of the generator motor which directly contributes to change in the present charging rate. Due to this, the switchover timing can be set in more appropriate manner.

In the above hybrid construction machine, it is preferable that the controller calculates the present charging rate according to the voltage reference mode under the situation where the operation of the generator motor is continuously suspended for a predetermined period of time.

Calculation of the present charging rate according to the voltage reference mode can be carried out instantly. On the other hand, even when charge and discharge of the battery becomes 0 (the generator motor is suspended), voltage of the battery does not become equal to a value corresponding to open voltage due to polarization of the battery. Due to this, calculation accuracy is low when the present charging rate is calculated immediately after the suspension of operating the generator motor.

Accordingly, in the above embodiment, the present charging rate is calculated under the situation where the operation of the generator motor is continuously suspended for a predetermined period of time. Due to this, the present charging rate can be calculated when voltage of the battery is at a value corresponding to open voltage, thereby increasing calculation accuracy.

The above construction machine preferably comprises a work electric motor which is driven by electric power supplied from the battery; an operating member which is operated to drive the work electric motor; and an operation detector which detects operation to the operating member, wherein the controller switches over the calculation mode to the voltage reference mode when the switchover timing is arrived, provided that the operation detector detects that there is no operation for driving the work electric motor.

When the construction machine comprises the work electric motor driven by electric power supplied from the battery, discharge current is generated by operation of the work electric motor. Due to this, battery voltage is not stabilized only by suspension of operating the generator motor.

Therefore, according to the above embodiment, the calculation mode is switched to the voltage reference mode only under the situation such that there is no operation for driving the work electric motor. Due to this, the present charging rate can be more accurately calculated when voltage of the battery is stabilized.

The hybrid construction machine preferably further comprises a self-propelled lower propelling body and an upper slewing body which is mounted on the lower propelling body to be capable of slewing, wherein the work electric motor is constructed by a slewing electric motor which slews the upper slewing body relative to the lower propelling body by means of electric power from the battery and charges the battery by acting as a generator when slewing speed of the upper slewing body is reduced.

When the construction machine comprises the slewing electric motor, charge-discharge electric current is generated due to operation of the slewing electric motor, therefore battery voltage is not stabilized only by suspending the generator motor.

In the above embodiment, the calculation mode is switched to the voltage reference mode only under the situation such that there is no operation for driving the slewing electric motor. Due to this, the present charging rate can be more accurately calculated when voltage is stabilized.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A hybrid construction machine, comprising:
   a hydraulic actuator;
   a battery;
   an engine as a power source;
   a hydraulic pump which is connected to the engine as a hydraulic source for the hydraulic actuator;
   a generator motor which is connected to the engine, charges the battery by acting as a generator by power from the engine and assists the engine by acting as an electric motor by electric power from the battery;
   a voltage detector which detects terminal voltage of the battery;
   a current detector which detects charge current and discharge current of the battery;
   a work electric motor electrically connected to the battery and the generator motor;
   an operating member which is operated to drive the work electric motor;
   an operation detector which detects operation to the operating member; and
   a controller which calculates a present charging rate as a currently remaining charged amount of the battery, wherein
   the controller
   (A) can switch over a calculation mode of calculating the present charging rate between a current integration mode, in which the charge current and the discharge current of the battery detected by the current detector are integrated and the integrated value of the charge current is added to an initial charging rate of the battery as well as the integrated value of the discharge current is subtracted from the initial charging rate of the battery to calculate the present charging rate, and a voltage reference mode in which the present charging rate is determined based on a predefined relation between terminal voltage and charging rate of the battery and terminal voltage of the battery detected by the voltage detector;

(B) calculates, during operation of the generator motor, the present charging rate according to the current integration mode, forces the generator motor to suspend operation in a case that the operation detector detects that there is no operation for driving the work electric motor after a switchover time is determined to arrive at a predetermined switchover timing, and calculates the present charging rate according to the voltage reference mode; and (C) after calculation of the present charging rate according to the voltage reference mode, restores the calculation mode back to the current integration mode from the voltage reference mode and cancels the suspension of operating the generator motor, and wherein the predetermined switchover timing is set such that a degree of accumulated error in the current integration mode is not excessive or beyond a certain amount.

2. The hybrid construction machine according to claim 1, wherein the controller measures an accumulated operation time of the hybrid construction machine as well as defines the switchover timing based on a timing when the accumulated operation time reaches a predetermined value.

3. The hybrid construction machine according to claim 2, wherein the controller starts measurement of the accumulated operation time at the same time as the generator motor starts operation thereof and resets the accumulated operation time according to the suspension of operating the generator motor due to the switchover timing.

4. The hybrid construction machine according to claim 1, wherein the controller calculates the present charging rate according to the voltage reference mode under the situation where the operation of the generator motor is continuously suspended for a predetermined period of time.

5. The hybrid construction machine according to claim 1, further comprising a self-propelled lower propelling body; and an upper slewing body which is mounted on the lower propelling body to be capable of slewing, wherein the work electric motor includes a slewing electric motor which slews the upper slewing body relative to the lower propelling body by electric power from the battery and charges the battery by acting as a generator when slewing speed of the upper slewing body is reduced.

* * * * *